(12) United States Patent
    Sbalchiero

(10) Patent No.: US 10,330,730 B2
(45) Date of Patent: Jun. 25, 2019

(54) METHOD AND APPARATUS FOR DETERMINING THE ELECTRIC RESISTANCE OF A COIL CONNECTION OF ARMATURE COILS

(71) Applicant: ATOP S.p.A., Barberino Val d'Elsa, Florence (IT)

(72) Inventor: Federico Sbalchiero, Florence (IT)

(73) Assignee: ATOP S.p.A., Barberino Val d'Elsa (IT)

( * ) Notice: Subject to any disclaimer, the term of this patent is extended or adjusted under 35 U.S.C. 154(b) by 181 days.

(21) Appl. No.: 15/319,248

(22) PCT Filed: Jun. 25, 2015

(86) PCT No.: PCT/IB2015/054771
    § 371 (c)(1),
    (2) Date: Dec. 15, 2016

(87) PCT Pub. No.: WO2016/012880
    PCT Pub. Date: Jan. 28, 2016

(65) Prior Publication Data
    US 2017/0146604 A1    May 25, 2017

(30) Foreign Application Priority Data

Jul. 22, 2014  (IT) ............................... TO2014A0575

(51) Int. Cl.
    *G01R 31/34*    (2006.01)
    *G01R 27/02*    (2006.01)

(52) U.S. Cl.
    CPC .......... *G01R 31/346* (2013.01); *G01R 27/02* (2013.01)

(58) Field of Classification Search
    CPC .............................. G01R 31/346; G01R 27/02
    (Continued)

(56) References Cited

U.S. PATENT DOCUMENTS 4,053,830 A    10/1977  Porter
4,651,086 A     3/1987  Domenichini et al.
                        (Continued)

FOREIGN PATENT DOCUMENTS

DE        3707862     9/1988
EP        0695946     2/1996
KR    20010067798     7/2001

*Primary Examiner* — Giovanni Astacio-Oquendo
(74) *Attorney, Agent, or Firm* — Haley Guiliano LLP

(57) ABSTRACT

A method and an apparatus for determining the electric resistances of coil connections (RSi) of connections (1-12) of coils (Bi) of a winding (102) of a dynamo electric machine, which includes a plurality of coils (Bi) connected in series. A first current (I1) is generated through a first coil connection (1) of a first coil (B1) of the winding (102). Furthermore, a second current (I2) is generated through a first coil connection (3, 7) of a second coil (B2, B6) of the winding in such a way as to eliminate the current flowing through a portion (B8-B11) of the winding, which is proximate to the first coil connection (1) of the first coil (B1) and the first coil connection (3,7) of the second coil (B2, B6). A third current (I3) is also generated in a second coil connection (2) of the first coil (B1). The generating of the first current (I1), the generating of the second current (I2), and the generating of the third current (I3) are made with respect to a common potential (13). Measurements are made of a first voltage (V1) across a third coil (B12), which is adjacent to the first coil (B1), and of the current (I1) flowing through the first coil connection (1) of the first coil (B1). From these measurements a determination is made of the resistance (RS1) of the first coil connection (1) of the first coil (B1).

12 Claims, 5 Drawing Sheets

Figure 1:
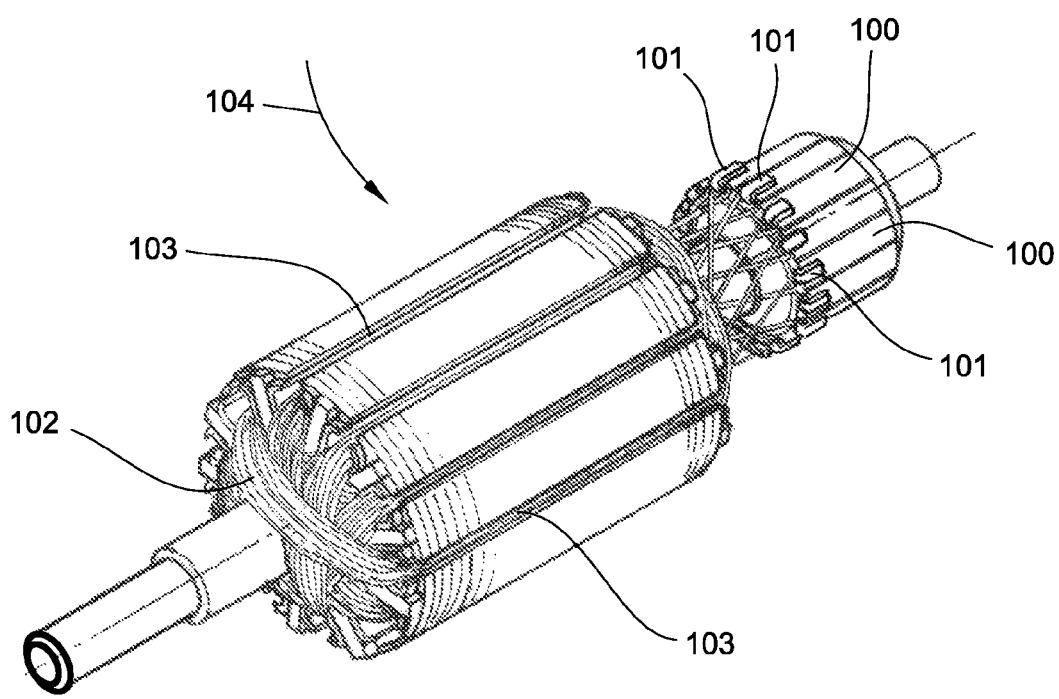

(58) Field of Classification Search
USPC .................................. 324/713, 691, 649, 600
See application file for complete search history.

(56) References Cited

U.S. PATENT DOCUMENTS

| | | | |
|---|---|---|---|
| 5,307,019 A | 4/1994 | Robey et al. | |
| 6,479,987 B1* | 11/2002 | Marx ....................... | G01B 7/30 324/207.12 |
| 6,593,751 B2* | 7/2003 | Takahashi ............ | G01R 31/346 324/509 |
| 2002/0067162 A1* | 6/2002 | Dammkohler ............ | F02D 9/10 324/207.21 |
| 2014/0210479 A1* | 7/2014 | Rink ...................... | G01R 1/203 324/426 |
| 2015/0253370 A1* | 9/2015 | Fantoni .............. | G01R 31/1272 702/58 |
| 2016/0131692 A1* | 5/2016 | Jaffrey ............... | G01R 31/1272 324/544 |

* cited by examiner

METHOD AND APPARATUS FOR DETERMINING THE ELECTRIC RESISTANCE OF A COIL CONNECTION OF ARMATURE COILS

BACKGROUND OF THE INVENTION

The present invention concerns processes and apparatus for determining coil connections' resistance and coils' electric resistance by means of testing machines used in production lines for manufacturing dynamoelectric core components and their related windings, for example in the manufacturing of armatures of electric motors.

A coil connection is typically made for each coil to a commutator bar, or other terminal means for passage of electric current between each coil and an external supply. The coil connection is normally accomplished by positioning and fusing the lead conductor of the coil to or terminal, which has the form of a hook ("tang") or other suitable configuration.

Fusing machines for permanently anchoring a lead conductor to a commutator bar have been described in EP 0419, 849 A1. Machines for forming coils of windings of cores of dynamoelectric machines have been described in EP 484, 766 A2.

The quality of the manufactured connection is verified by testing devices, which measure the electrical resistance of the connections to the commutator bar, or to any other type of terminal means. This electrical resistance is indicative of the quality of the connection made, i.e. whether the lead has been anchored with the required electrical and mechanical properties.

In addition to measuring the electrical resistance of the coil connections, the electric resistance of the coils is also verified. The electric resistance of a coil is indicative of the number of turns that have been wound, and whether the conductor has been excessively elongated or insufficiently tightened by the tension applied during winding.

A process for determining the electric resistance of coil connections of a winding of a dynamoelectric machine having the characteristics of the preamble of method claim 1, and an apparatus according to the preamble of claim 8 have been described in U.S. Pat. No. 4,651,086 and EP 695,946A2.

The testing device of the foregoing prior art circulates electric current each time only through certain coils of the winding that have connections that need to be determined. In addition, a feedback regulating loop circuit is used to eliminate the current circulating in a remaining series of coils, whilst maintaining the opposite leads of this remaining series of coils substantially at the same voltage. In this way, the measurement and knowledge of the voltage and current of the coils where the current is circulating makes it possible to determine their electric resistance and the electric resistance of their connections.

The drawback of this prior art is that the current circulating through the coils that are being verified is influenced and in part derives from the above mentioned feedback regulating loop circuit. During the measurements, the regulation requires a certain stabilization time before taking reliable test values. In other words, a certain waiting time is required before making the measurements that determine the coil connections' electric resistance and the coils' electric resistance. The waiting time is typically due to the filtering effect of the feedback regulation system. The waiting time is a penalizing time, which decreases the number of cores that can be tested in a certain time by a testing machine.

In addition to the above, a same testing machine is often used both for measuring the coil connections' resistance, and the coils' electric resistance of cores, where the coils have significantly different sizes. These coils of different core categories can have very different inductive and electric resistance ranges. Consequently, and particularly in the situation of coils having large electric resistance values, the small current that is applied for carrying out the measurement can easily be partially dispersed. This results in less precision in the determination of the coil connection electric resistance and the coil electric resistance.

OBJECT OF THE INVENTION

It is thus an object of the present invention to provide a method and apparatus of the type mentioned above in which the determination of the coils' electric resistance can be more rapid.

It is also an object of the present invention to make it possible to be more rapid in the determination of the coils' electric resistance.

It is another object of the present invention to make the determination of the connections' electric resistance more accurate.

It is also an object of the present invention to make the determination of the coils' electric resistance more accurate.

It is another object of the present invention to provide a method and an apparatus, which are capable of determining the coil connections' electric resistance, or the coils' electric resistance using test voltages, or test currents that are particularly suited for the size of the coil being tested.

SUMMARY OF THE INVENTION

According to the invention the foregoing scopes are achieved using a process as indicated in claim 1 and an apparatus as indicated in claim 8.

The process and apparatus of the present invention uses a regulation circuit capable of eliminating the current in the coils that do need to be determined, however without influencing the current that needs to circulate in other coils where the measurements need to be made. In other words, the electric currents used for measuring the coil connections' electric resistance and the coils' electric resistance can be independent of the current used by the regulation circuit for eliminating the current passing in the remaining series of coils of the winding.

In this way, it is also possible to use current measurements, which are specifically suited for the size of the coils whose resistance needs to be measured. This results in the testing machine being particularly accurate for testing a plurality of different sizes of coils.

DETAILED DESCRIPTION OF THE PREFERRED EMBODIMENTS

Figure 2:
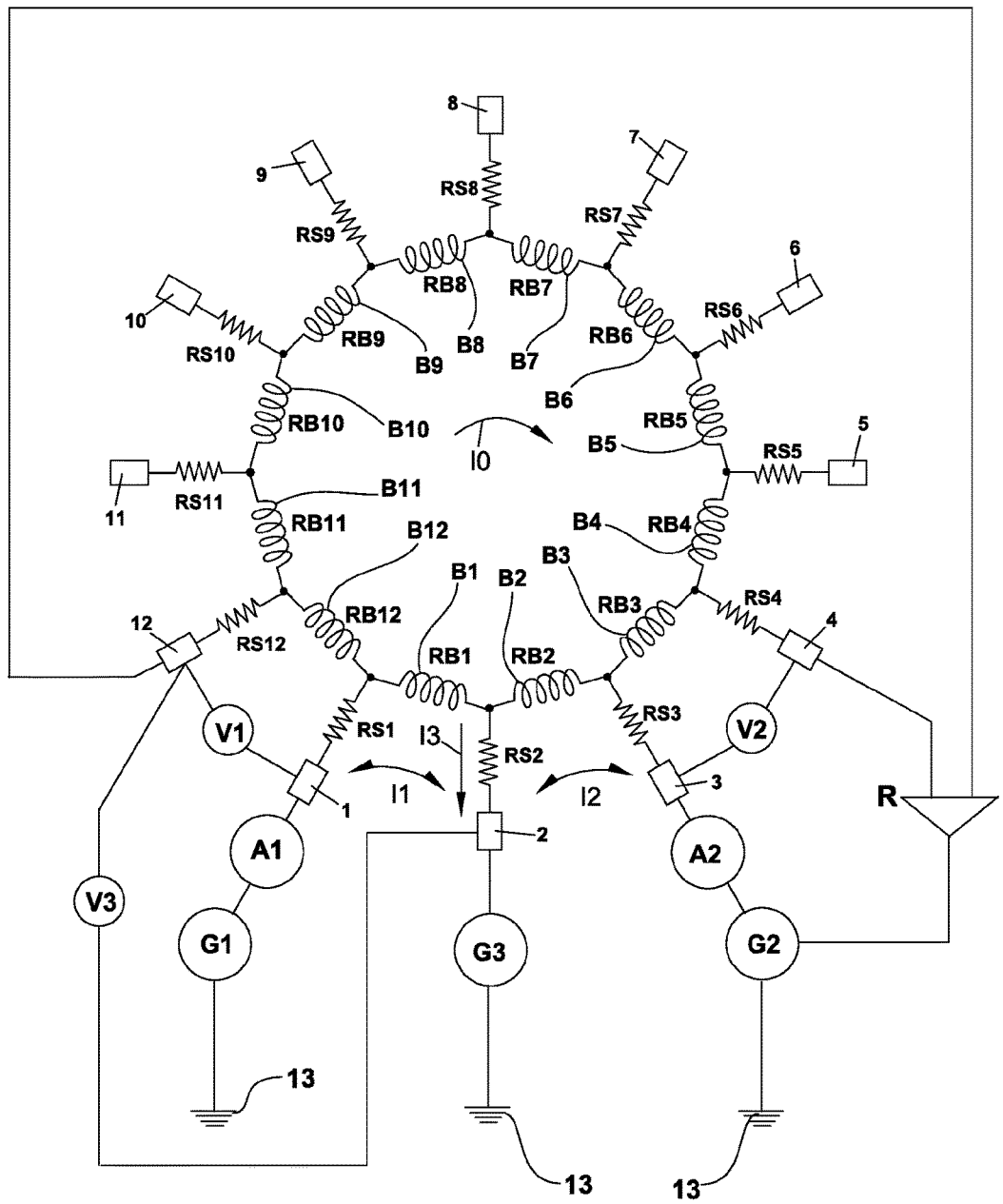
Figure 3:
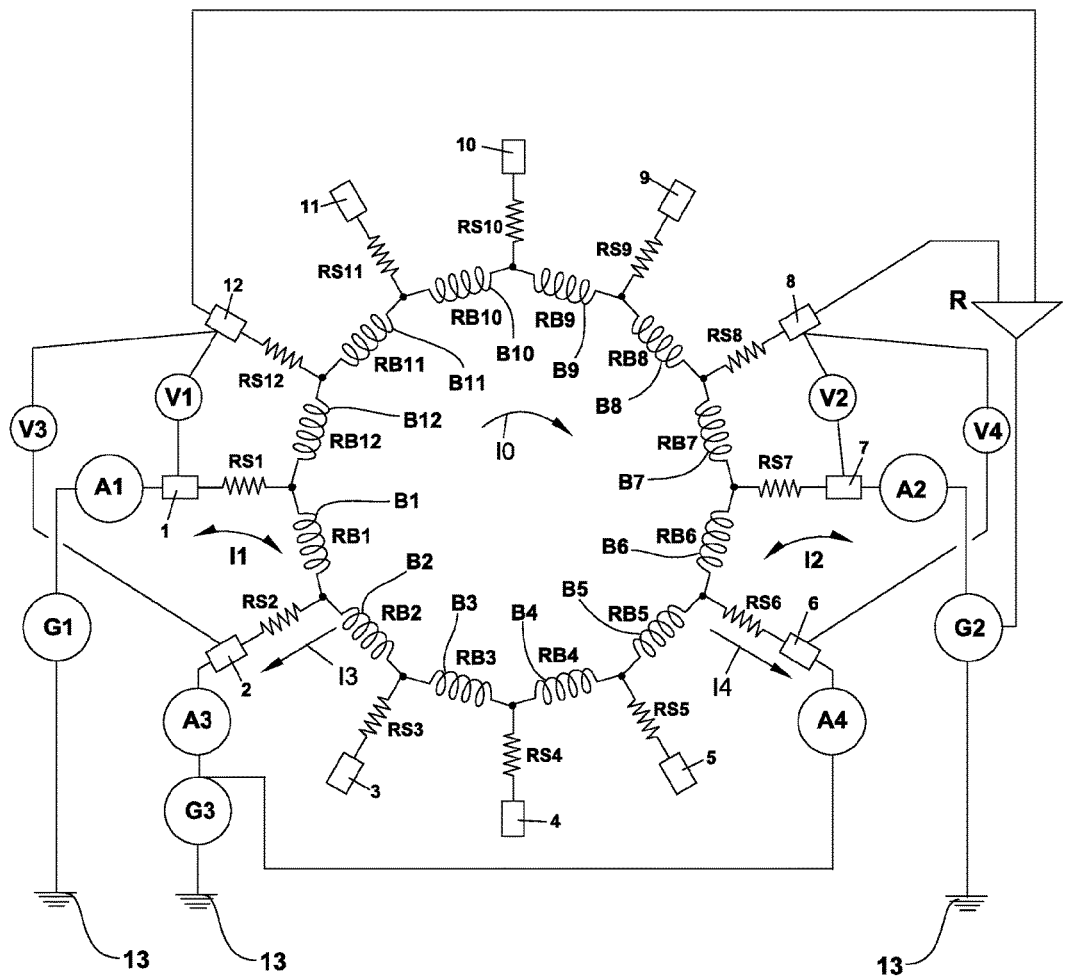
Figure 4:
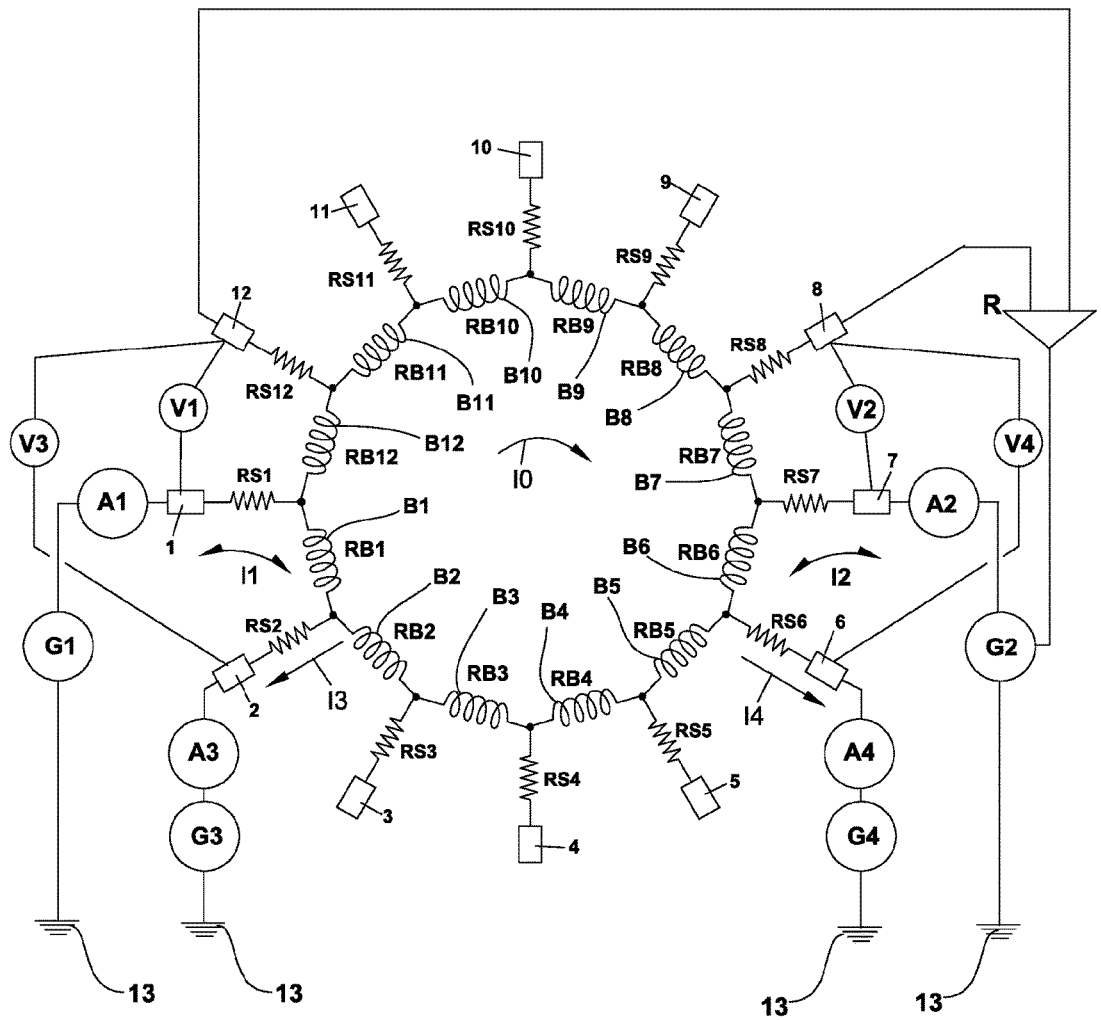
Figure 5:
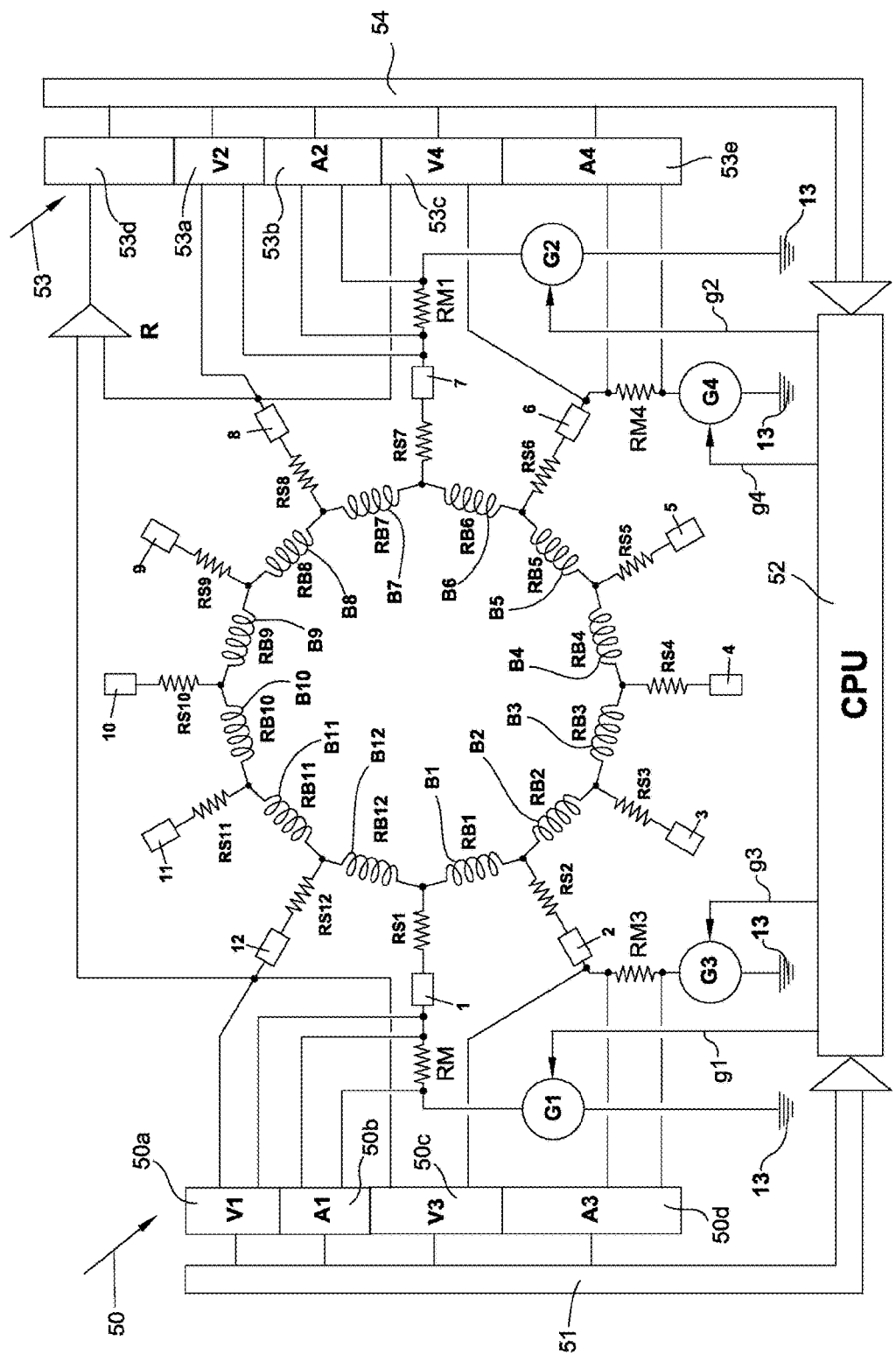

Further features and advantages of the present invention will become apparent from the following description, given purely by way of non-limiting example with reference to the accompanying drawings, in which:

FIG. 1 is an example of a dynamo electric component comprising an armature provided with a winding having fused coil connections, FIG. 2 is a circuit diagram showing the measurement of the various coil connections' electric resistances and the various coils' electric resistances in accordance with a first embodiment of the invention, FIG. 3 is a circuit diagram showing the measurement of the various coil connections' electric resistances and the various coils' electric resistances in accordance with a second embodiment of the invention, FIG. 4 is a circuit diagram showing the measurement of the various coil connections' electric resistances and coils' electric resistances in accordance with a third embodiment of the invention, FIG. 5 is a schematic circuit diagram showing the use of analog and digital components for the measurement of the various coils' connection resistances and coils' resistances in accordance with the embodiment of FIG. 3.

With reference to FIGS. 1 and 2, the resistance of the various coil connections are labeled RS1, RS2 etc. . . . These are typically the electrical resistances encountered by the current passing from each coil 102 of the core winding through the joint that is created between the wire of the coil and an external connection member, like a commutator bar 100, or other suitable terminal. In the case of FIG. 1, the joints are fused connections on hooks ("tang") like 101. The electric resistance of the various coils 102 are indicated as B1, B2 . . . and their electrical resistances are indicated respectively as RB1, RB2 etc. . . . Each electric resistance RBi of a generic coil Bi is influenced by the number of turns of wire that have been wound to form the coil and the resulting diameter of the wire that forms the coil. For example, a coil that has been wound with a number of turns that are different from the prescribed value, or has been wound by using an incorrect tension, will have an unacceptable electric resistance RBi.

For example, a tang joint where the wire insulation has not been properly removed during fusing, or where the surface of the tang connection on the commutator bar is insufficient, will have an unacceptable electric resistance RSi.

Connection members 1-12 of FIG. 2-5 can be considered the circuit representation of commutator bars 100 of FIG. 1.

During a measurement step to determine a coil connection electric resistance like RS1 and a coil electric resistance like RB1 (see FIG. 2) a fixed current I1 is induced, for example by a voltage generator G1, which applies a voltage to connection member 1 with respect to a potential point 13. Potential point 13 can be for example a mass point, as shown in FIG. 2.

In addition, a circuit for inducing a variable current, which can be for example a variable voltage generator G2, applies a voltage to the connection member 3 with respect to the potential point 13. The voltage generator G2 is controlled by a regulation circuit R, which receives the voltage levels existing between the connection members 12 and 4. The regulation circuit R controls with a feedback signal generator G2 to assure that the tension between the connection members 12 and 4 is negligible, and therefore that current I0 which circulates in electric resistances of the coils including RB11 and RB4 is negligible. More particularly, regulator R accomplishes that the tension in connection members 12 and 4 is precisely the same, so that there is no current flowing in the coil resistances going from RB11 o RB4.

Furthermore, with reference to FIG. 2, a fixed current I3 is induced, for example by a voltage generator G3, which applies a voltage to connection member 2 with respect to the same potential point 13.

With this arrangement, generators G1 and G2 are required and dedicated to eliminating current I0, whilst generator G3 is required and dedicated to supplying the measurement currents.

As a result of this arrangement, current I1 from generator G1 is flowing in coil connection resistance RS1 of the coil connection 1 and in coil resistance RB1, and current I2 resulting from generator G2 is flowing in coil connection resistance RS3 of the coil connection 3 and in coil resistance RB2.

Current I1 can be measured by means of ammeter A1. Current I2 can be measured by means of ammeter A2. The sum of currents I1 and I2 is equal to current I3.

The voltage between connection members 1 and 12 can be measured with voltmeter V1. The voltage between connection members 3 and 4 can be measured with voltmeter V2.

A negligible current is flowing in coil resistance RB11 seeing that it belongs to the winding portion where the current is eliminated by regulation circuit R. Also negligible is the current flowing through resistance RS12 of connection 12, and through resistance RB12 of coil B12.

Therefore, connection resistance RS1 of connection 1 can be determined from the relation V1/I1.

Similarly, RS3 can be determined from the relation V2/I2.

The voltage between connection members 12 and 2 can be measured with voltmeter V3

RB1 can be determined from the equation:

$$RB1*I1+RS2*(I1+I2)=V3,$$

In fact, considering that RS2 is many times smaller than resistance RB1, then the addend RS2*(I1+I2) can be considered null in the above equation, and consequently RB1 can be determined from $$RB1=V3/I1.$$

If this approximation is not desired, then prior to using the above equation for determining RB1, resistance RS2 can be determined by carrying out steps like those that have been described above for determining RS1. This can be achieved with generators G1, G3 and G2 applied respectively to connection members 2, 3, and 4, and with ammeters A1 and A2 respectively applied along lines of connection members 2 and 4. In this situation voltmeter V1 is applied between connection members 1 and 2, V2 is applied between connection members 4 and 5, and V3 is applied between connection members 1 and 3. This entire modified arrangement can be accomplished by indexing the core in a clockwise direction by an angular spacing equal to the angle separating two adjacent connection members like connection members 1 and 2.

For the measurements steps required to determine RS1, RB1 and RS2, the voltages applied by generators G1 and G2 can be chosen in values with the primary scope of eliminating the current I0 by using the regulation of G2, whilst the voltage applied by generator G3 is chosen with the purpose of having a more adequate current for carrying out the determination of the coil resistances and the connection resistances.

By using this approach, the generation of voltages for the current I0 elimination is independent of the generation of the voltage applied for receiving the current used to measure the resistances.

It is possible to accomplish successive index steps of the armature and corresponding measurement steps, like has been described in the foregoing, in order to determine all the coil connection resistances RS1-RS12, and all the coil resistances RB1-RB12.

FIG. 3 is an arrangement in which two connection resistances RS1 and RS7 and two coil resistances RB1 and RB6 can be determined before needing to index the core. This results in being able to save time in the measurements.

More particularly, in this embodiment generator G1 can be connected to connection member 1. Generator G2 can be connected to connection member 7, and generator G3 can be connected to connection members 2 and 6. Generator G2 can be regulated by regulation circuit R to eliminate the passage of current I0 in the coils connected between connection member 12 and connection member 8

The following equations can apply:

$$RS1=V1/I1,$$

where V1 and I1 can be measured respectively by voltmeter V1 and ammeter A1, and therefore RS1 can be determined.

$$RB1*I1+RS2*I3=V3,$$

from which RB1 can be determined, seeing that currents I1 and I3 can be measured respectively by ammeter A1 and ammeter A3, and V3 can be measured by voltmeter V3. RS2 can be determined after one angular index and using measurement steps, like those performed for determining RS1. As an alternative RS2 can be considered negligible with respect to RB1, therefore RS2*I3 can be considered null in the equation, which thus results in $$RB1=V3/I1.$$

For the same angular position of the commutator:

$$RS7=V2/I2,$$

where V2 and I2 can be measured respectively by voltmeter V2 and ammeter A2, and therefore RS7 can be determined.

$$RB6*I2+RS6*I4=V4,$$

from which RB6 can be determined, seeing that I2 and I4 can be measured respectively by ammeter A2 and ammeter A4, and V4 can be measured by voltmeter V4. Resistance RS6 can be determined after one angular index, and a series of measurement like those performed for determining RS7. As an alternative, RS6 can be considered negligible with respect to RB6, like has been indicated above for RS2 compared to RB1, therefore:

$$RB6=V4/I2.$$

FIG. 4 illustrates another arrangement in which two connection resistances RS1 and RS7, and two coil resistances RB1 and RB6 can be determined before needing to index the core. The arrangement of FIG. 4 uses two generators G3 and G4 instead of one generator G3, like is shown in FIG. 3. The two generators G3 and G4 of FIG. 4 will be smaller and need to produce approximately half the current, if compared with the single generator G3 used in the solution of FIG. 3.

In the solution of FIG. 4, generator G1 can be connected to connection member 1. Generator G2 can be connected to connection member 7, and generator G3 can be connected to connection member 2, whilst generator G4 can be connected to connection member 6. Generator G2 can be regulated by regulation circuit R to eliminate the passage of current I0 in the coils connected between connection member 12 and connection member 8

The following equations can apply:

$$RS1=V1/I1,$$

where V1 and I1 can be measured respectively by means of voltmeter V1 and ammeter A1, therefore RS1 can be determined.

$$RB1*I1+RS2*I3=V3,$$

From which RB1 can be determined, seeing that I1 and I3 can be measured respectively by ammeter A1 and ammeter A3, and V3 can be measured by voltmeter V3. RS2 can be determined after one angular index and a series of measurement like those performed for determining RS1. As an alternative RS2 can be considered negligible with respect to RB1, therefore RS2*I3 can be considered null in the equation, thus:

$$RB1=V3/I1.$$

For the same angular position of the commutator there is also that:

$$RS7=V2/I2,$$

where V2 and I2 can be measured respectively by voltmeter V2 and ammeter A2, and therefore RS7 can be determined.

$$RB6*I2+RS6*I4=V4,$$

From which RB6 can be determined seeing that I2 and I4 can be measured respectively by ammeter A2 and ammeter A4, and V4 can be measured by voltmeter V4.

Resistance RS6 can be determined after one angular index, and by carrying out a series of measurement like those performed for determining RS7. As an alternative RS6 can be considered negligible with respect to RB6, like has been described in the foregoing in the comparison of RS2 with respect to RB1, therefore:

$$RB6=V4/I2.$$

FIG. 5 shows the circuit diagram for a solution where digital components are used in the testing machine for carrying out measurements and determinations like those described with reference to FIG. 4.

An analog digital converter 50 receives analog signal V1 in channel 50a and converts the measurement into digital data, which is transferred to central processing unit (CPU) 52 via BUS 51.

Analog signal A1 from a measurement resistance RM is received in channel 50b and is converted into digital data, which are transferred to CPU 52 via BUS 51.

Analog signal V3 is received in channel 50c and is converted into digital data, which are transferred to CPU 52 via BUS 51.

Analog signal A3 from a measurement resistance RM3 is received in channel 50d and is converted into digital data, which are transferred to CPU 52 via BUS 51.

A second digital converter 53 receives analog signal V2 in channel 53a and converts the measurement into digital data, which are transferred to CPU 52 via BUS 54.

Analog signal A2 from a measurement resistance RM1 is received in channel 53b and is converted into digital data, which are transferred to CPU 52 via BUS 51.

Analog signal V4 is received in channel 50c and is converted into digital data, which are transferred to CPU 52 via BUS 53.

Voltage feedback of regulation circuit R is connected to channel 53d so that the difference in tension between connection members 12 and 8 is fed as digital data to CPU 52.

Analog signal A4 from a measurement resistance RM4 is received in channel 53e and is converted into digital data, which is transferred to CPU 52 via BUS 51.

CPU 52 elaborates the measurement and solves the equation as described in the foregoing to determine the various resistances. Furthermore, CPU 52 send drive signals to digital generators G1, G2, G3, G4 along respective lines g1, g2, g3, g4 to induce currents I1, I2, I3, I4 and make negligible current I0, as has been described in the foregoing.

Naturally, while the principle of the invention remains the same, the details of construction and the embodiments may widely vary with respect to what has been described and shown purely by way of example, without departing from the scope of the present invention.

The invention claimed is:

1. A method for determining the electric resistances of connections of coils of a dynamo-electric machine winding which includes a plurality of coils connected in series, said method comprising the steps of:
    providing a first generator for generating a first current through a first coil connection of a first coil of the winding;
    providing a second generator for generating a second current through a first coil connection of a second coil of the winding so as to eliminate the current flowing through a portion of the winding that is proximate to the first coil connection of the first coil and the first coil connection of the second coil; and
    providing a third generator for generating a third current in a second coil connection of the first coil;
    wherein the generating of the first current, the generating of the second current and the generating of the third current are made with respect to a common potential; the method further comprising:
    measuring a first voltage across a third coil that is adjacent to the first coil and connected to the first coil connection of the first coil; the first coil connection of the first coil being the first coil connection of the third coil;
    measuring the current flowing through the first coil connection of the first coil; and
    determining the resistance of the first coil connection of the first coil from the first voltage and the measured current flowing through the first coil connection of the first coil.

2. The method of claim 1, further comprising:
    measuring a second voltage across a fourth coil that is adjacent to the second coil and connected to the first coil connection of the second coil;
    measuring the current flowing through the first coil connection of the second coil; and
    determining the resistance of the first coil connection of the second coil from the second voltage and the measured current flowing through the first coil connection of the second coil.

3. The method of claim 2, further comprising:
    measuring a third voltage between the second coil connection of the third coil and the second coil connection of the first coil, and
    determining the resistance of the first coil from the measure third voltage and the measured current flowing through the first coil connection of the first coil.

4. The method of claim 3, wherein the steps are sequentially repeated for other coils of the winding, whereby the resistance of each coil is determined.

5. The method of claim 1, wherein the second coil connection of the first coil is also the second coil connection of the second coil.

6. The method of claim 1, wherein the steps are sequentially repeated for other coil connections of the winding, whereby the resistance of each coil connection is determined.

7. The method of claim 1 further comprising:
    providing a fourth generator for generating a fourth current in a second coil connection of the second coil;
    wherein the generating of the fourth current is made with respect to the common potential of the generating of the first current, the generating of the second current and the generating of the third current; the method further comprising:
    measuring a second voltage across a fourth coil that is adjacent to the second coil and connected to the first coil connection of the second coil;
    measuring the current flowing through the first coil connection of the second coil; and
    determining the resistance of the first coil connection of the second coil from the second voltage and the measured current flowing through the first coil connection of the second coil.

8. The method of claim 1, wherein the generating a second current through a first coil connection of a second coil of the winding in order to eliminate the current flowing through a portion of the winding comprises:
    measuring a feedback voltage between the second coil connection of the third coil and a second coil connection of a fourth coil, wherein the fourth coil is adjacent to the second coil and connected to the first coil connection of the second coil; and
    regulating the generation of the second current to make the feedback voltage equal to zero.

9. An apparatus for determining the electric resistances of connections of coils of a dynamo-electric machine winding which includes a plurality of coils connected in series, said apparatus comprising:
    a first generator for generating a first current through a first coil connection of a first coil of the winding;
    a second generator for generating a second current through a first coil connection of a second coil of the winding so as to eliminate the current flowing through a portion of the winding that is adjacent to the first coil connection of the first coil and the first coil connection of the second coil; and
    a third generator for generating a third current in a second coil connection of the first coil;
    wherein the generating of the first current, the generating of the second current and the generating of the third current are made with respect to a common potential; the apparatus further comprising:
    a first voltmeter for measuring a first voltage across a third coil that is adjacent to the first coil and connected to the first coil connection of the first coil;
    wherein the first coil connection of the first coil is the first coil connection of the third coil; the apparatus further comprising:
    a central processing unit for determining the resistance of the first coil connection of the first coil from the first voltage and the measured current flowing through the first coil connection of the first coil.

10. The apparatus of claim 9, further comprising a first ammeter for measuring the first current flowing through the first coil connection of the first coil.

11. The apparatus of claim 9, wherein the generating the second current through the first coil connection of the second coil of the winding so as to eliminate the current flowing through a portion of the winding further comprises:
    a circuit for measuring a feedback voltage between the second coil connection of the third coil and a second coil connection of a fourth coil, wherein the fourth coil is adjacent to the second coil and connected to the first coil connection of the second coil; and
    wherein the circuit for measuring the feedback voltage is coupled to the central processing unit for determining the resistance to regulate the generation of the second current to make the feedback voltage equal to zero.

12. The apparatus of claim 9, further comprising:

a fourth generator for generating a fourth current in a second coil connection of the second coil;

wherein the generating of the fourth current is made with respect to the common potential of the generating of the first current, the generating of the second current and the generating of the third current; the apparatus further comprising:

a second voltmeter for measuring a second voltage across a fourth coil that is adjacent to the second coil and connected to the first coil connection of the second coil;

a second ammeter for measuring the second current flowing through the first coil connection of the second coil; and wherein the central processing unit determines the resistance of the first coil connection of the second coil using the second voltage and the measured current flowing through the first coil connection of the second coil.

* * * * *